United States Patent [19]

Deleonibus et al.

[11] Patent Number: 4,592,802
[45] Date of Patent: Jun. 3, 1986

[54] METHOD OF FABRICATION OF ALUMINUM CONTACTS THROUGH A THICK INSULATING LAYER IN AN INTEGRATED CIRCUIT

[75] Inventors: Simon Deleonibus, Grenoble; Guy Dubois, St. Etienne de Crossey, both of France

[73] Assignee: Societe pour l'Etude et la Fabrication des Circuits Integres Speciaux E.F.C.I.S., Grenoble, France

[21] Appl. No.: 721,779

[22] Filed: Apr. 10, 1985

[30] Foreign Application Priority Data

Apr. 13, 1984 [FR] France ................. 84 05906

[51] Int. Cl.⁴ ............... C23F 1/02; B44C 1/22; C03C 15/00; H01L 21/306
[52] U.S. Cl. .................. 156/644; 29/580; 29/591; 156/652; 156/656; 156/657; 156/662; 357/71; 427/88; 427/90

[58] Field of Search ............. 29/580, 591, 577; 427/88, 89, 90, 91; 357/65, 71; 156/643, 644, 646, 652, 653, 656, 657, 659.1, 662; 204/192 EC, 192 E

[56] References Cited

U.S. PATENT DOCUMENTS 4,520,041 5/1985 Aoyama et al. .......... 156/656 X
4,544,445 10/1985 Jeuch et al. .............. 156/643

FOREIGN PATENT DOCUMENTS 56-69843 6/1981 Japan ..................... 156/643

Primary Examiner—William A. Powell
Attorney, Agent, or Firm—Oblon, Fisher, Spivak, McClelland & Maier

[57] ABSTRACT

In order to form aluminum interconnections through a thick insulating layer in an integrated circuit without any attendant danger of rupture at the level of the contact openings in the insulating layer between the interconnection layer and the substrate, the contact openings are first filled with polycrystalline silicon or a metal having high covering power and deposited by chemical decomposition in gas phase, whereupon the aluminum is deposited by vacuum evaporation.

3 Claims, 8 Drawing Figures

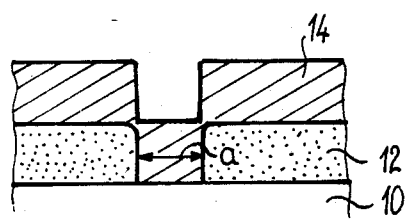
FIG_1
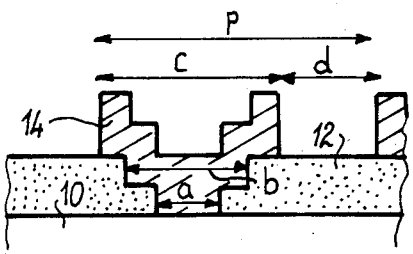
FIG_2
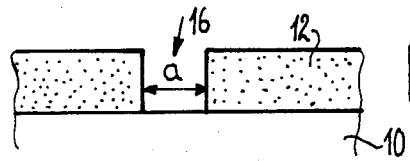
FIG_3
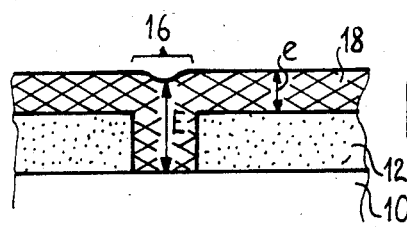
FIG_4
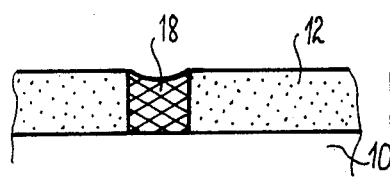
FIG_5
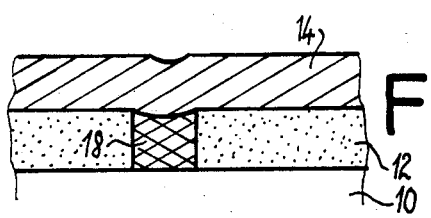
FIG_6
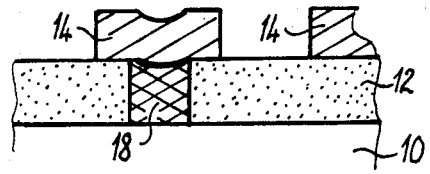
FIG_7
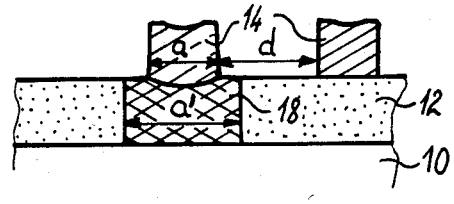
FIG_8

METHOD OF FABRICATION OF ALUMINUM CONTACTS THROUGH A THICK INSULATING LAYER IN AN INTEGRATED CIRCUIT

BACKGROUND OF THE INVENTION

It is a common practice in the fabrication of integrated circuits to make use of an interconnecting layer of aluminum (which has high conductivity while also being readily deposited and etched) for connecting the different elements of the integrated circuit to each other. This layer usually rests on an insulating layer of relatively substantial thickness (of the order of one micron or more) which is in turn located above the subjacent elements of the integrated circuit. The insulating layer is opened prior to deposition of the aluminum in order to expose the surfaces with which it is desired to establish a metallic interconnection. These surfaces can be monocrystalline silicon surfaces (transistor sources and drains, collectors, bases and emitters) or polycrystalline silicon surfaces (field-effect transistor gates) or even metallic surfaces of another interconnecting layer.

The substantial thickness of the insulating layer arises from the need to reduce stray capacitances between the interconnecting conductors and the circuit elements above which said conductors pass.

Unfortunately, this thickness makes it difficult to obtain contacts having surfaces of very small area and located at very small intervals between the interconnecting layer and the circuit elements.

In fact, should it be desired to have narrow contact surfaces located very close together, it is found necessary to carry out (vertical) directional etching of the contact openings in the insulating layer. However, if special precautions are not taken, this directional etching produces openings having sharp edges which are liable to result in fractures of the aluminum at the time of deposition by vacuum evaporation. The precautions which may be taken consist in particular of deposition of the insulating layer in two steps and etching of the layer also in two steps. However, these precautions produce an increase in the pitch between conductors (pitch = width + spacing) at the level of the contacts.

SUMMARY OF THE INVENTION

The present invention proposes a solution which guards against the danger of fracture of the aluminum while also avoiding any increase in the pitch between conductors or even makes it possible to reduce the pitch. Moreover, this invention is more generally applicable to the formation of an interconnecting layer of metal other than aluminum but deposited by vacuum evaporation in the same manner and therefore equally subject to a considerable risk of fracture at the level of a sharp edge.

The method in accordance with the invention consists, after deposition of an insulating layer which serves as a support for the interconnecting layer, in etching narrow contact openings and in depositing by chemical vapor deposition a conductive material (especially doped polycrystalline silicon) having a high covering power both on vertical substrate surfaces and on horizontal substrate surfaces. The thickness of the deposit thus formed is sufficient to ensure that the entire volume of the narrow contact openings is filled and to ensure that the thickness of said material opposite to said openings is distinctly greater than the thickness above the insulating layer. The method then consists in removing the conductive material outside the narrow contact openings by uniform vertical anisotropic etching to a depth corresponding to the thickness deposited over the entire surface of the insulating layer outside the narrow openings so as to remove the conductive material outside said openings while removing only a small proportion of said material within the openings. Finally, said method consists in depositing by vacuum evaporation and then etching a metallic interconnecting layer (especially of aluminum or an aluminum alloy).

The conductive material which can be deposited is preferably polycrystalline silicon but can also be titanium, tungsten, or molybdenum. In some cases, consideration can even be given to the deposition of a conductive material consisting of a first layer of aluminum on condition that this layer is deposited by chemical vapor deposition and not by evaporation.

The lateral dimensions of the narrow openings are preferably of the order of one to two microns approximately.

BRIEF DESCRIPTION OF THE DRAWINGS

Other features of the invention will be more apparent upon consideration of the following description and accompanying drawings, wherein:

FIG. 1 illustrates a contact opening showing the risk of fracture of the aluminum;

FIG. 2 illustrates a known solution for limiting the risk of fracture;

FIGS. 3 to 7 show the successive steps of fabrication of interconnections in accordance with the invention;

FIG. 8 shows diagrammatically the reduction in overall size permitted by the invention in respect of a predetermined minimum width of contact.

DETAILED DESCRIPTION OF THE INVENTION

In FIG. 1, a semiconductor substrate (of silicon) incorporating circuit elements which have been omitted from the drawings is designated by the reference numeral 10. This substrate has been coated with an insulating layer (silicon oxide) 12 in which a contact opening has been etched prior to deposition by vacuum evaporation of a conducting interconnecting layer 14 of aluminum which is intended to be etched in order to define an interconnection pattern.

If the thickness of the insulating layer 12 is substantial (and in particular of the same order of magnitude as the metallic layer 14), the aluminum deposited by evaporation is deposited on the insulating layer and at the bottom of the contact opening with a reduction in thickness or even a risk of total rupture between the two since the aluminum deposited by evaporation does not pass readily over the abrupt steps (low covering power on the vertical edges).

In order to guard against this danger, a method explained with reference to FIG. 2 has been adopted by way of example as follows: the insulating layer 12 is deposited in two or more layers of much smaller thickness than the desired final thickness. For example, a first layer having one-half the desired final thickness is deposited and etched so as to form a contact opening having the desired width a. A second insulating layer is then deposited so as to obtain the desired total thickness. This second layer is etched (during a controlled period of time in order to prevent any attack on the first layer, the impurity-type dopant concentrations being different in each of the two layers in order to ensure that the first layer is less readily etched than the second layer). Etching of the second layer is performed above the first contact opening but over a greater width b than the width a with a sufficient margin to ensure that a double step instead of a single step as in the case of FIG. 1 is formed on all sides of the contact opening in spite of any variations in positioning. The aluminum is then deposited and passes relatively well over these double steps of much smaller thickness (one-half) than in FIG. 1. The aluminum can be etched while nevertheless retaining above the contact opening a width c which is greater than the width b so as to ensure that the two steps of the insulating layer are totally covered by the aluminum in spite of any variations in positioning. If the minimum spacing between two adjacent conductors is d, the pitch of the conductors is necessarily $p = c + d$.

The method in accordance with the present invention will now be described.

In FIG. 3, the semiconductor substrate 10 is shown without the incorporated circuit elements. The insulating layer 12 (having a thickness of approximately one micron) which is intended to serve as a support for the interconnecting layer has been deposited on said substrate in a single operation.

A contact opening 16 having a width a corresponding to the desired contact width has been cut in the insulating layer, preferably by vertical anisotropic etching. Said width a is preferably comprised between one and two microns approximately in respect of a thickness of insulating layer 12 of approximately one micron.

A conductive layer 18 having high covering power on both vertical and horizontal surfaces is deposited by chemical decomposition in gas phase. The deposited thickness e is slightly greater than a/2 and such that the entire volume of the opening 16 is filled with conductive material and that this thickness as it appears above the insulating layer is considerably smaller than the thickness E which is present above the contact opening 16 (as shown in FIG. 4).

The conductive material deposited by chemical decomposition is preferably doped polycrystalline silicon but can also consist of another metal (such as tungsten, molybdenum, titanium or even aluminum).

This material is then etched uniformly by vertical anisotropic etching without a mask and therefore above the insulating layer 12 as well as above the contact opening 16. The etching operation is carried out so as to remove only a thickness e, with the result that the insulating layer is laid bare whilst the contact opening 16 is left practically filled with a thickness $E - e$ (as shown in FIG. 5). Interruption of the etching operation is defined either by accurately controlling the etching time or by end-of-attack detection by any suitable means (variation in pressure or color of the gases resulting from the attack).

The interconnection layer 14 proper (in particular of aluminum or aluminum alloy) is then deposited by conventional sputtering. As shown in FIG. 6, the result thereby achieved is that there no longer exists any abrupt step transition.

This layer can be etched (as shown in FIG. 7) so as to define the desired interconnection pattern.

Should it be desired to reduce the width and the pitch between adjacent conductors to a minimum, it is quite possible by means of the method in accordance with the invention to ensure that the width of the contact opening is not completely covered by the conductor after etching, as is clearly shown in FIG. 8.

Thus, if it is required for reasons of resistivity of the conductors, resistivity of the contact and fineness of etching that the minimum width of the conductor should have the value a and that the spacing between two adjacent conductors should have the value d, it is an easy matter to provide a contact opening having a width a' which is greater than a with a sufficient margin to make allowance for any inaccuracies in superposition of successive masks which define the contact openings and the conductors which pass over said openings. By way of example, a' = b. In this case, it is apparent that the pitch between adjacent conductors can be a + d whereas it was c + d in FIG. 2 and that c was distinctly greater than a.

A final point worthy of note is that, if so desired, the method in accordance with the invention makes it possible to reduce the thickness of interconnection metal since this thickness is no longer necessarily equal to the thickness of the insulating layer as was the case in the prior art.

The invention also permits contact formation between a second aluminum interconnection level and the substrate. A contact of this type is difficult to establish by reason of the considerable thickness of insulating material between the substrate and the second level of aluminum. This possibility is permitted, however, only on condition that deposition by chemical decomposition in gas phase is performed at a temperature which is compatible with the integrity of the subjacent layers.

What is claimed is:

1. A method of fabrication of an interconnection layer in an integrated circuit, comprising the steps which consist in depositing a relatively thick insulating layer on a substrate which incorporates integrated circuit elements already formed, etching a narrow contact opening in said layer, depositing by vacuum evaporation and etching an interconnection metal, wherein said method comprises, after etching of the narrow contact openings and prior to deposition by evaporation of the interconnection metal:

deposition by chemical decomposition in gas phase of a conductive material having a high covering power both on vertical substrate surfaces and on horizontal substrate surfaces, the deposition being performed to a sufficient depth to ensure that the entire volume of the narrow contact opening is filled with conductive material and to ensure that the thickness of said material opposite to said opening is distinctly greater than the thickness above the insulating layer;

etching of said material by vertical anisotropic etching to a uniform depth corresponding substantially to the thickness deposited over the entire surface of the insulating layer so as to remove the conductive material outside the opening while removing only a small proportion of said material within said opening.

2. A method of fabrication according to claim 1, wherein the conductive material is polycrystalline silicon or tungsten or molybdenum or titanium.

3. A method of fabrication according to claim 1, wherein the lateral dimensions of the narrow openings are comprised between one and two microns approximately in respect of a thickness of insulating layer of approximately one micron.

* * * * *